United States Patent
Dastidar et al.

(10) Patent No.: US 7,246,334 B1
(45) Date of Patent: Jul. 17, 2007

(54) TOPOLOGICAL ANALYSIS BASED METHOD FOR IDENTIFYING STATE NODES IN A SEQUENTIAL DIGITAL CIRCUIT AT THE TRANSISTOR LEVEL

(75) Inventors: Tathagato Rai Dastidar, Bangalore (IN); Partha Ray, Bangalore (IN)

(73) Assignee: National Semiconductor Corporation, Santa Clara, CA (US)

( * ) Notice: Subject to any disclaimer, the term of this patent is extended or adjusted under 35 U.S.C. 154(b) by 22 days.

(21) Appl. No.: 11/305,253

(22) Filed: Dec. 16, 2005

(51) Int. Cl.
*G06F 17/50* (2006.01)
(52) U.S. Cl. .............................................. 716/4; 716/5
(58) Field of Classification Search .................... 716/4, 716/5
See application file for complete search history.

(56) References Cited

U.S. PATENT DOCUMENTS 6,308,300 B1 * 10/2001 Bushnell et al. ................ 716/4
2006/0200787 A1 * 9/2006 Teene .......................... 716/12

* cited by examiner

*Primary Examiner*—Paul Dinh
*Assistant Examiner*—Nha Nguyen
(74) *Attorney, Agent, or Firm*—Stallman & Pollock LLP

(57) ABSTRACT

State nodes in a sequential digital circuit are identified using a graph-based method based upon the topology of the circuit. In accordance with the method, the device level circuit netlist is reduced to a graph representation using a well-defined set of rules. The unique properties of state nodes can be translated to properties of the graph representation of the circuit. Identification of state nodes is required for proper initialization of sequential circuits for simulation by a device level digital simulator.

2 Claims, 2 Drawing Sheets

US 7,246,334 B1

TOPOLOGICAL ANALYSIS BASED METHOD FOR IDENTIFYING STATE NODES IN A SEQUENTIAL DIGITAL CIRCUIT AT THE TRANSISTOR LEVEL

TECHNICAL FIELD

The present invention relates to integrated circuit design and, in particular, to an efficient method for identifying state nodes in a sequential digital circuit at the transistor level by analyzing the topology of the circuit, thereby avoiding the need for simulation of the circuit.

DESCRIPTION OF THE INVENTION

Figure 1:
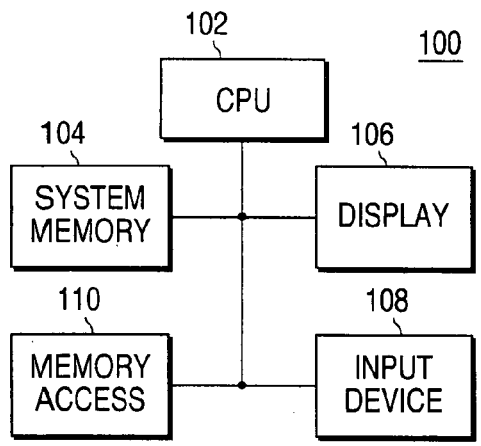
FIG. 1 is a block diagram illustrating a conventional data processing system.

FIG. 1 shows a well-known general architecture of a data processing system 100 that can be utilized to execute a program implementation of a topological based method for identifying state nodes in a sequential digital circuit in accordance with the concepts of the present invention. The data processing system 100 includes a central processing unit (CPU) 102 and a system memory 104 that is connected to the CPU 102. The system memory 104 typically stores the operating system for the CPU 102 as well as data and various sets of program instructions for applications programs to be executed by the system 100. For example, the system memory 104 could store a software program, i.e. a sequence of machine readable program instructions, needed to implement a method in accordance with the present invention. Typically, the computer system 100 also includes a display 106 that is connected to the CPU 102 to allow images to be visually displayed to a user, a user input system 108, e.g., a keyboard or mouse, that allows the user to interact with the system 100, and a memory access system 110 that enables transfer of data both within the system 100 and between the system 100 and systems external to the system 100, e.g. a computer network to which the system 100 is connected. All of these components and the ways in which they interact are well known to persons skilled in the art.

A state node in a sequential digital circuit represents a memory element. It has two stable states, i.e. logic 1 and logic 0, and can retain its value or memory until some other data is written to the memory element. For example, the outputs of all flip-flops in a sequential circuit are state nodes; a flip-flop output retains its value until a clock pulse is applied to the flip-flop, irrespective of any change in the data input.

Structurally, a state node is any node on a combinatorial feedback loop in a circuit. Typically, identification of state nodes is required for proper initialization of sequential circuits for simulation by a device level digital simulator. The usefulness of state nodes and their application in efficient simulation of large digital circuits at the transistor level is discussed in commonly-assigned and co-pending application Ser. No. 11/166,535, filed Aug. 8, 2005, which application is hereby incorporated by reference in its entirety to provide additional background information regarding the present invention.

Commonly-assigned and co-pending application Ser. No. 11/167,523, filed on Jun. 27, 2005, discloses a method for identifying state nodes in a sequential digital circuit. The method disclosed in application Ser. No. 11/167,523 is based upon simulation of the circuit under all valid input combinations. Application Ser. No. 11/167,523 is hereby incorporated by reference in its entirety to provide additional background information regarding the present invention.

The method described in application Ser. No. 11/167,523 makes no assumption about the structure of the circuit being tested. It does not use pattern matching techniques to identify latches, feedback, loops etc. Hence, it was independent of the circuit design method. The described method identifies a set of minimal combinatorial loops in the circuit and picks one node from each such loop as a state node. It identifies a set of properties that a minimal combinatorial loop in a circuit must satisfy irrespective of the design methodology in use. Sets of nodes satisfying these properties are identified by means of simulation.

A potential problem with the method described in application Ser. No. 11/167,523 is that it needs to simulate the circuit under test for all valid input combinations, and possibly more than once for each valid input combination. Thus, for an n input circuit, the number of simulations to be performed is $O(2^n)$. For a circuit with large number of inputs, this figure can be prohibitively large. Thus, there is a need for a method that can identify state nodes in a digital circuit more efficiently.

The present invention provides a method for identifying state nodes in a sequential digital circuit based upon analysis of the topology of the circuit. The device level circuit netlist is first reduced to a graph representation. A method of creating this graph is described in co-pending and commonly-assigned application Ser. No. 11/205,420, filed on Aug. 17, 2005, which is hereby incorporated by reference in its entirety. The following discussion describes how the properties of minimal combinatorial loops, as stated in application Ser. No. 11/167,523, can be translated into properties of this graph representing the circuit topology. Procedures for identifying such properties are presented. It is also shown that the topology-based method of the present invention is an order of magnitude more efficient than the method described in application Ser. No. 11/205,420.

The following describes a method for reducing the device level netlist of a circuit to a graph. The input is a circuit netlist with its input, output, in/out (I/O) nodes, as well as the power supply and ground nodes, identified. This method builds on the method of constructing the graph described in application Ser. No. 11/205,420.

A graph $G=(V, E_1, E_2)$ is defined, where V is a set of vertices, $E_1$ is a set of directed edges, and $E_2$ is a set of undirected edges. There can be both a directed edge and an undirected edge between a pair of vertices in the graph. Given the schematic of a circuit, such a graph can be constructed by applying the following rules: (1) for each node in the circuit (including input, output and I/O nodes), a vertex is created in the graph, ignoring the power supply and ground nodes; (2) for every transistor in the circuit, a directed edge is added from the vertex representing the gate node to the vertex representing the source node if the source node is not the power supply or ground node, a directed edge is added from the vertex representing the gate node to the vertex representing the drain node if the drain node is not the power supply or ground node, and an undirected edge is added between the source and drain nodes if none of them are the power supply or ground nodes; (3) for every sub-module in the circuit, a directed edge is added from each input of the sub-module to all of its outputs; no connections are created to the power supply and ground nodes; and (5) multiple edges of the same type (directed or undirected) between two nodes are replaced by a single edge of the same type.

If there is a directed edge from vertex A to vertex B, then vertex A is denoted as the parent of vertex B; vertex B is denoted as a child of vertex A. Two vertices connected by an undirected edge are called peers. The weight of all edges is taken as 1.

Figure 2:
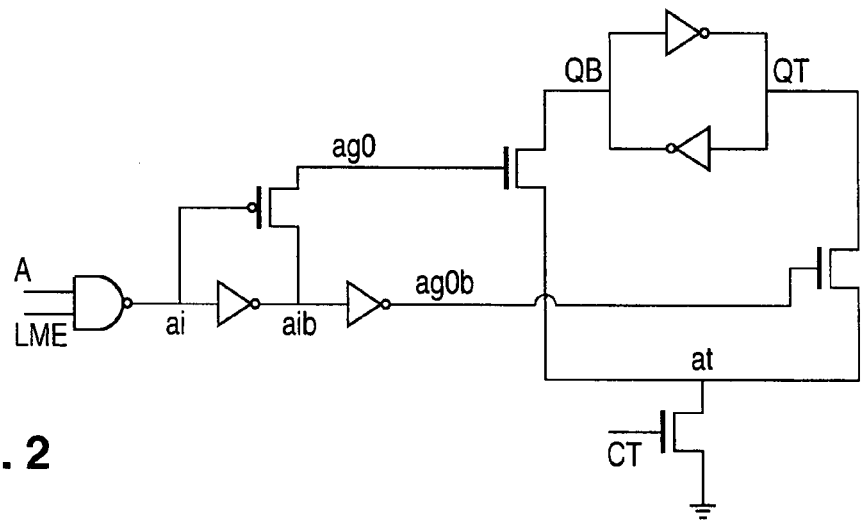
FIG. 2 is a schematic drawing illustrating an embodiment of a conventional circuit containing state points.
Figure 3:
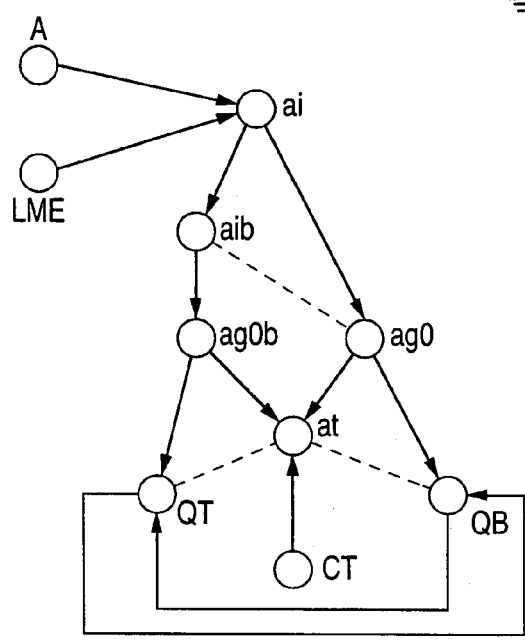
FIG. 3 is a graph representation of the FIG. 2 circuit.

FIG. 2 shows an example of a sequential circuit used in a memory block. It contains state nodes. A graph created from the FIG. 2 schematic is shown in FIG. 3. In the FIG. 3 graph, the directed edges are shown as arrows and the undirected edges are shown as dotted lines.

As stated above, application Ser. No. 11/167,523 describes properties that a state node must satisfy irrespective of the circuit design methodology. It classifies the set of potential state nodes into a set of equivalence classes. Nodes belonging to the same equivalence class are part of the same minimal combinatorial loop. Equivalence classes are defined as a set of nodes satisfying the following properties: (1) the set must consist of more than one node; (2) each node in the set must evaluate to a logic value of X under some (possibly all) input combinations; (3) under all valid input combinations, either all nodes in the set evaluate to a non-X (0 or 1) logic value, or all nodes evaluate to X; (4) if a value of 0 or 1 is initially assigned to any node in the set, all other nodes in the set evaluate to a logic value of 0 or 1 under some input combinations; and (5) there exists at least one node in each set such that assigning a non-X value (0 or 1) to that node initially, results in all other nodes in the set evaluating to a logic value of 0 or 1 under all input combinations.

Application Ser. No. 11/167,523 further proves that the above set of properties is necessary and sufficient for identifying minimal combinatorial loops in a sequential digital circuit. The following describes how the above properties can be translated into easily identifiable characteristics of the graph representation.

In the graph representation, an equivalence class of nodes has the following properties: (1) nodes belonging to the same equivalence class must be reachable from each other in the graph representation, i.e. they must be part of the same loop of the graph, the path(s) between any two nodes in the class can consist of both directed and undirected edges, and self loops (i.e. nodes with outgoing edges which point back to itself) are ignored while identifying loops; (2) the loop should consist of at least two directed edges; (3) input nodes cannot be part of the equivalence class; (4) there must exist at least one input such that all paths from the input to any node in the equivalence class consist of at least one undirected edge; (5) nodes that are part of the loop, but do not have any outgoing directed edge, cannot be part of the equivalence class; and (6) there exists at least one node in the equivalence class from which all other nodes in the equivalence class are reachable via directed edges only.

It is now shown that the set of properties of the nodes in an equivalence class in the graph representation are necessary and sufficient to represent the properties of equivalence classes as stated in application Ser. No. 11/167,523. However, before a formal proof is provided, please note the following properties of directed and undirected edges: (1) a directed edge represents the logical connection between the gate of a MOS transistor with its drain or source. A change in potential or logic value at the gate results in a change in the conductivity of the transistor channel and can thus cause a change of state at the drain or source. Thus, the tail node of a directed edge (representing the gate) drives the head node (representing the source or drain); and (2) an undirected edge represents a transistor channel. This channel can be cut off by applying a suitable potential at the gate. Thus, the two ends of an undirected edge can be electrically separated from each other. A change of state at one of the nodes does not necessarily signify a change of state at the other node. Thus, these nodes do not drive each other.

Properties (1) and (2) of the graph representation model property 1 of application Ser. No. 11/167,523, i.e. it requires that each equivalence class consist of at least two nodes. A method in accordance with the present invention ignores self loops and requires that the loop consists of at least two directed edges. Also note that multiple edges of the same type between two nodes are replaced by a single edge in the graph representation. Thus, it can be said that the loop consists of more than one node.

Property (3) of the graph representation requires that no input can be part of the equivalence class. This is expected because nodes in the equivalence class are expected to be driven by each other under some input combinations, and inputs cannot be driven by any node in the circuit (it ceases to be an input in that case).

Property (5) excludes those nodes in the loop that have no outgoing directed edges from the equivalence class. This is because nodes without any outgoing directed edges cannot be driving any other node under any circumstances, as discussed above.

Property (6) identifies a node in the loop that has paths to all other nodes in the loop. This means that this node drives all other nodes under all circumstances. In other words, this identifies the drive node of the equivalence class.

Properties (2) and (3) of application Ser. No. 11/167,523 require that the nodes in the class are not combinatorial functions of the inputs. This is not entirely reflected by the set of properties of the graph representation. However, an intuitive explanation is provided.

Property (4) requires that all nodes in the loop be reachable from at least one input via an undirected edge (or a channel edge). To understand the rationale for this requirement, consider the following. Given an input node and a loop of the graph, there can be three possible scenarios: (1) The loop is not reachable from the input at all, (2) at least one node in the loop is reachable from the input via directed edges only, and (3) all paths from the input to the loop consists of at least one undirected edge. In the first situation, the said loop is not affected by the input at all and thus is not a function of the input. Thus, it is of no interest to us. In the second situation, at least one node in the loop is reachable from the input by directed edges only. This means that at least one node in the loop is being driven by the input (since directed edges denote driven paths, as discussed earlier). Given an input combination where all nodes in the loop have valid logic states, this node can never get to X (unknown logic state) for any valid value of the said input, other inputs remaining the same. The third situation means that all paths from the said input to the said loop can be cut off under some circumstances (since undirected edges can be cut off). This means that under some circumstances, the input will not be driving any node in the loop. Thus, given an input combination where all nodes in the loop are X, the state of these nodes cannot be changed by varying the said input. This indicates that the nodes in the loop are not a combinatorial function of at least one input.

The following describes the procedure for detecting equivalence classes of nodes in the graph representation.

During the depth first search (DFS) traversal of the graph as shown in Procedures 1, 2 and 3, provided below, each node or vertex in the graph can have three states: WHITE, GRAY and BLACK. The state is recorded in the color field of each vertex. A state of WHITE means that the vertex has not yet been reached in the course of traversal. A state of BLACK means that the vertex has been reached, and all other vertices reachable from the vertex have also been traversed. A state of GRAY indicates that the vertex has been reached, but not all vertices reachable from it have been traversed.

A vertex has two other fields: the dfs-parent field, which denotes the parent of this vertex in a DFS tree, and the cycle field, which denotes the loop to which this vertex belongs (if any).

Procedure 1 (DFS), provided below, describes the top level DFS algorithm. It is analogous to the DFS procedure given in "Introduction to Algorithms" by Cormen et al., MIT Press, 1990. The input to this procedure is the graph G=(V, E). In lines 2 to 6 of Procedure 1, all nodes are initialized so that their color is WHITE, and the dfs-parent and cycle fields are empty (NIL). It then calls the procedure DFS-Visit on all vertices having color WHITE.

```
1        Procedure 1: DFS(G)
2            foreach vertex v ∈ G. V. do
3                v.color ← WHITE
4                v.dfs-parent ← NIL
5                v.cycle ← NIL
6            endforeach
7            foreach vertex v ∈ G. V. do
8                if(v.color = WHITE) then
9                    DFS-Visit (v, NIL)
10               endif
11           endforeach
12       end DFS
```

Procedure 2 (DFS-Visit), provided below, performs the actual traversal of the graph. The arguments to this procedure is a vertex v and another vertex p. Vertex v has been reached from vertex p.

```
1        Procedure 2: DFS-Visit (v, p)
2            f(v.color = BLACK) then
3                return
4            endif
5            if(v. color = GRAY) then
6                Trace-Cycle(v,p)
7                return
8            endif
9            v.color ← GRAY
10           v.dfs-parent ← p
11           foreach vertex c ∈ v.children, do
12               DFS-Visit(c, v)
13           endforeach
14           foreach r ∈ v.peers
15               DFS-Visit(r, v)
16           endforeach
17           v.color ← BLACK
12       end DFS-Visit
```

If the color of vertex v is BLACK, then the procedure exits without doing anything. If the color is GRAY, this indicates that vertex v has been visited, and it is also reachable from some descendant (i.e. a vertex reachable from v). Clearly, the vertices v and p lie in a cycle. Hence, it calls Procedure 3 (Trace-Cycle) to create this cycle and then exits. Otherwise (i.e. the color of v is WHITE), it sets the color to GRAY. It then recursively calls Procedure 2 (DFS-Visit) on all its children (i.e. vertices connected to it by directed edges) with v as the second argument. After this, it also calls Procedure 2 (DFS-Visit) on all its peers (i.e. vertices connected to it by undirected edges). When all the recursive calls finish, the color of v is set to BLACK and the procedure exits.

Procedure 3 (Trace-Cycle), provided below, enumerates all nodes that lie in the same cycle. It takes two arguments—vertex a (the ancestor vertex) and vertex d (the descendant vertex). If neither vertex a nor vertex d belongs to a cycle, then the variable current-cycle is set to a new cycle. Otherwise, it is set to the cycle to which vertex a or vertex d belongs. Note that a cycle is just a set of nodes. Vertices a and d are then added to current-cycle (line 7). The procedure then traces back from vertex d to vertex a using the dfs-parent field of each node. Each node encountered in the process is added to current-cycle. To understand the rationale, consider this: Vertex a has been reached from vertex d. But vertex a is also an ancestor of vertex d (i.e., vertex d has been reached by some path from vertex a), since the color of vertex a is GRAY. Thus, all vertices in the path from vertex a to vertex d lie in the same cycle. However, if any node in the path including vertex a and vertex d is found to be a circuit input, the cycle is deleted.

```
1        Procedure 3: Trace-Cycle (a, d)
2            if(a is input ∨ d is inut) then
3                return
4            endif
5            if(a.cycler = NIL ∧ d.cycle = NIL) then
6                current-cycle ← (A new cycle)
7            else
8                current-cycle ← (The cycle to which a or d belongs)
9            endif
10           current-cycle ← current-cycle ∪ {a, d}
11           a.cycle ← current-cycle
12           d.cycle ← current-cycle
13           p ← d.dfs-parent
14           while(p ≠ a ∧ p ≠ NIL)
15               if (p is input) then
16                   delete current-cycle
17                   return
18               endif
19               if(p.cycle = NIL) then
20                   current-cycle ← current. cycle ∪ {p
21                   p.cycle ← current-cycle
22               endif
23               p ← p.dfs-parent
24           endwhile
25       end Trace-Cycle
```

After the top level Procedure 1 (DFS) finishes, a set of cycles has been provided in the graph. However, all cycles need not constitute equivalence classes, and all nodes in a cycle need not be state nodes. Thus, each cycle needs to be pruned by verifying all the properties of equivalence classes on each node.

Two all-pair shortest path matrices of the graph are created, one using only the directed edges (this is denoted by $M_1$), and another one using both the directed as well as the undirected edges (this is denoted by $M_2$). An entry (i, j) in the matrices denotes the minimum path length from vertex i to vertex j. This can be done using the standard Floyd Warshall's algorithm. If no path exists between a pair of nodes, then the path length is taken as infinity. Procedure 4 (Prune-Cycle), provided below, takes as argument a cycle c and verifies all properties of equivalence classes. The express |v.children| denotes the number of children of v and the express |c| denotes the size of the cycle c. The procedure starts by iterating over all nodes in the cycle, and deletes any node that has no outgoing directed edges (line 4). Otherwise, it checks whether there exists an input i such that v is not reachable from i by using directed edges only, but is reachable if undirected edges are also used. This corresponds to the situation $M_1(i,v)=\infty$ and $M_2(i,v)\neq\infty$. If no such inputs exist, the cycle c is rejected and an empty value (NIL) is returned. If in the process, the size of the cycle reduces to 1 or less, the cycle is rejected and an empty value (NIL) is returned. Thus, lines 2 to 20 verify Properties 4 and 5 of equivalence classes. It also verifies Property 2, since if |c|>1 and all nodes have outgoing directed edges, then c must contain at least two directed edges. Lines 21 to 33 detect the driver node in the loop, and return it. It returns an empty value if no drivers exists. Essentially, it checks that, for each vertex v, whether any other vertex u in the cycle is reachable by directed edges alone (this corresponds to the situation $M_1(v,u)\neq\infty$. Note that this also verifies the condition that the driver node has outgoing directed edges (otherwise $M_1(v,u)$ would by infinity for any u).

```
1      Procedure 4: Prunc-Cycle (c)
2        foreach v ∈ c, do
3          if(|v.children| = 0) then
4            c ← c-{v}
5          else
6            reachable ← false
7            foreach i ∈ inputs of the circuit, do
8              if(M₁(i,v) – ∞ ∧ M₂(i,v) ≠ ∞) then
9                reachable ← true
10               break out of foreach loop
11             endif
12           endforeach
13           if(reachable) then
14             return NIL
15           endif
16         endif
17         if(|c| ≤ 1) then
18           return NIL
19         endif
20       endforeach
21       foreach v ∈ c, do
22         found-driver ← true
23         foreach{u|u * c ∧ u ≠ v}, do
24           if(M1(v,u) = ∞) then
25             found-driver ← false
26             break out of foreach loop
27           endif
28         endforeach
29         if(found-driver) then
30           return v
31         endif
32       endforeach
33       return NIL
34     end Prune-Cycle
```

Procedure 5 (Find-State-Nodes), provided below, shows the top level procedure for finding the state nodes of a circuit. It takes as argument a circuit C. It first creates G=(V,E), the graph representation of the circuit C. It then creates two all pair shortest path (APSP) matrices using the Floyd Warshall's algorithm—one using only directed edges ($M_1$) and the other using both directed and undirected edges ($M_2$). It runs the procedure DFS on graph G to detect cycles. Once the cycles are detected, it calls Prune-Cycle on each cycle and reports the driver node (if any) of the cycle as a state node.

```
1      Procedure 5: Find-State-Nodes (C)
2        G ← Graph representation of C
3        M₁ ← APSP matrix with directed edges
4        M₂ ← APSP matrix with both types of edges
5        DFS(G)
6        foreach cycle c, do
7          v ← Prune-Cycle(c)
8          if(v ≠ NIL) then
9            report v as state node
10         endif
11       endforeach
12     end Find-State-Nodes
```

Note that the cycles found by Procedure 1 (DFS) are not necessarily the strongly connected components of the graph G. It treats two cycles connected by an undirected edge as two different cycles (this is because undirected edges are always traversed after directed edges). On the other hand, both the cycles belong to the same strongly connected component of the graph.

The procedure for finding transient state nodes, as described in application Ser. No. 11/205,420, is run on the same graph representation once the state nodes have been identified.

Here, an upper bound on the complexity of Procedure 5 (Find-State-Nodes) is provided. It starts with creating the graph representation of the circuit C. This process is linear in the number of components in C. Thus, it takes time $O(|V|)$. Creating the all pair shortest path martrices using Floyd Warshall's algorithm takes time $O(|V|^3)$ The complexity of the Procedure 3 (Trace-Cycle) is at most $O(|V|)$, since, in the worst case, it visits each node in the graph at most once. Excluding Procedure 3 (Trace-Cycle), Procedure 1 (DFS) takes time $O(|V|)+|E|)$, since all edges and vertices of the graph are traversed almost once. Together with Procedure 3 (Trace-Cycle), the complexity becomes $O(|V|.(|V|+|E|))$. The complexity of Procedure 4 (Prune-Cycles) is bounded by $O(|c|I|)$ or $O|c|^2)$, whichever is higher, where |I| is the number of inputs of the circuit. Thus, the total complexity of Procedure 5 (Find-State-Nodes is bounded by the complexity of Floyd Warshall's algorithm with is $O(|V|^3)$. This is a vast improvement over the procedure reported in application Ser. No. 11/167,523, since it replaces an exponential time procedure with a polynomial time procedure.

With reference to FIG. 2, it is taken from the leaf cell library of a SRAM using 0.35 μm technology. The corresponding graph is shown in FIG. 3. As is evident from the FIG. 3 graph, it contains one cycle, consisting of the nodes {at, QT, QB}. This cycle is reported by Procedure 1 (DFS). Note that the nodes QT and QB are not reachable from the input CT by directed edges alone. The node 'at' is rejected from the class by Procedure 4 (Prune-Cycle) since it has no outgoing directed edges. QB and QT satisfy the other properties of equivalence classes. Both QB and QT can be selected as driver nodes, and hence the choice is made arbitrarily.

Figure 4:
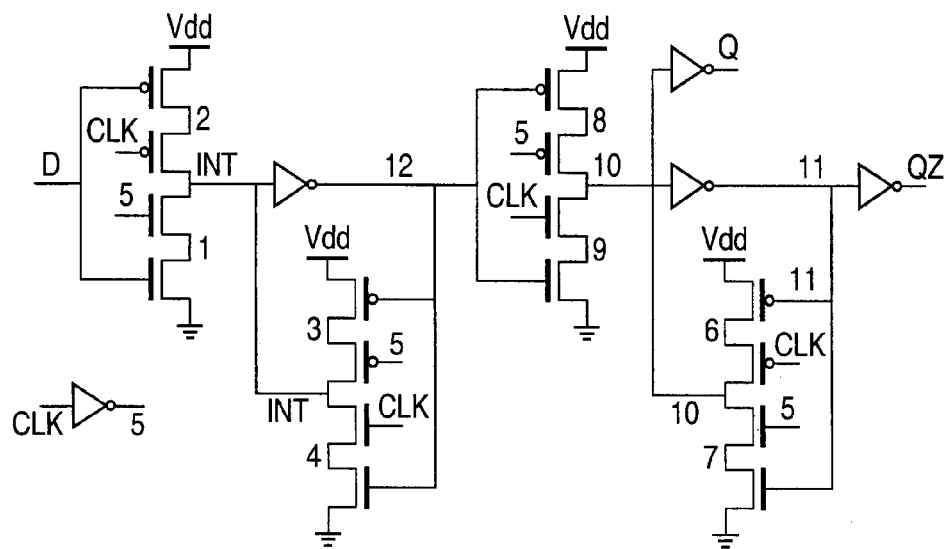
FIG. 4 is a schematic diagram illustrating a conventional D flip-flop circuit.
Figure 5:
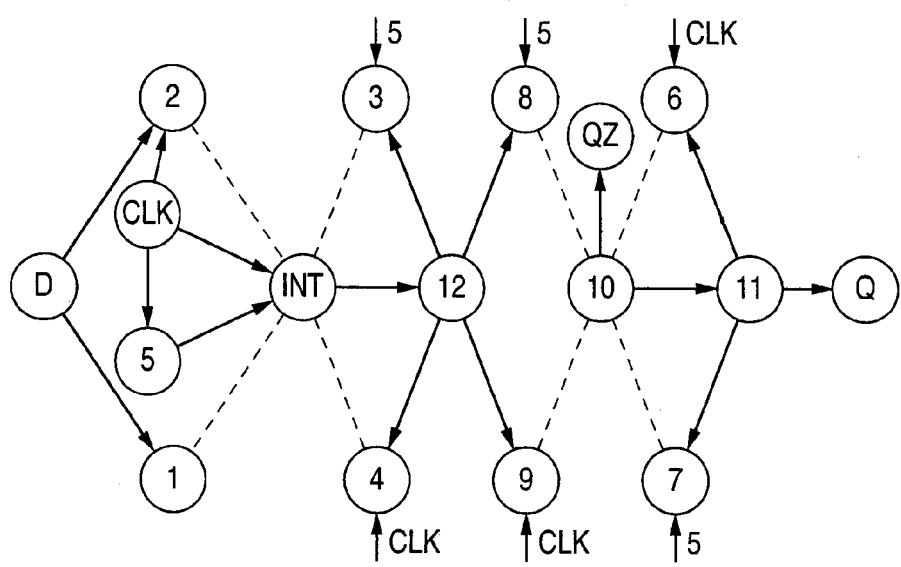
FIG. 5 is a graph representation of the FIG. 4 D flip-flop circuit created in accordance with the concepts of the present invention.

A schematic of a conventional D flip-flop circuit is shown in FIG. 4. The corresponding graph representation is shown in FIG. 5. Many outgoing edges from the nodes 5 and CLK are not shown in full, just the head of the edges is shown—this is just to make the figure more clear.

As is evident from FIG. 5, the graph consists of two cycles—{INT, 12, 3, 4} and {10, 11, 6, 7}. Out of these, the nodes 3, 4 6, and 7 are rejected from their respective cycles since they do not have outgoing directed edges. The remaining nodes from both cycles are not reachable from the input D by directed edges along. For the first cycle, the node INT is the driver since it has paths to all other nodes consisting of directed edges only. For the other cycle, the driver is the node 10.

In this document, a method is presented that can be used to identify state nodes in a sequential digital circuit. This method is based on topological analysis of the circuit and is thus much more efficient than the simulation based approach described in application Ser. No. 11/167,523. The essential properties of state nodes of a sequential digital circuit are presented and it is shown that these properties can be identified by analyzing the topology of the circuit.

It should be understood that the particular embodiments of the invention described above have been provided by way of example and that other modifications may occur to those skilled in the art without departing from the scope and spirit of the invention as expressed in the appended claims and their equivalents.

What is claimed is:

1. A method of identifying state nodes in a sequential digital integrated circuit, the method comprising:
  a. providing a schematic of the circuit;
  b. defining a graph $G=(V, E_1, E_2)$, where V is a set of vertices, $E_1$ is a set of directed edges, and $E_2$ is a set of undirected edges, and wherein both a directed edge and an undirected edge can exist between a pair of vertices in the graph, the graph being constructed in accordance with the following rules:
    (i) for each node in the circuit, including input, output and inout nodes in the circuit, creating a vertex in the graph, ignoring power supply nodes and ground nodes;
    (ii) for every transistor in the circuit, adding a directed edge from the vertex representing the gate node of said transistor to the vertex representing the source node of said transistor if the source node is not a power supply node or a ground node, adding a directed edge from the vertex representing the gate node of said transistor to the vertex representing the drain node of said transistor if the drain node is not a power supply node or a ground node, and adding an undirected edge between the vertices representing the source node and the drain node of said transistor if neither said source node nor said drain node is a power supply node or a ground node;
  c. in the defined graph, identifying loops of vertices having the following properties:
    (i) the loop consists of at least two directed edges;
    (ii) vertices representing input nodes can not be part of the loop;
    (iii) there must exist at least one input such that all paths from the input to any node in the loop consist of at least one undirected edge; and
    (iv) nodes that are part of the loop but do not have any outgoing directed edge cannot be a state node; and
    (v) there exists at least one node in the loop from which all other nodes in the loop are reachable by a directed edges only.

2. A machine-readable medium having stored thereon sequences of instructions for identifying state nodes in a sequential digital integrated circuit, the sequences of instructions including instructions that when executed by a data processing system, cause the data processing system to perform:
  a. providing a representation of a schematic of the circuit;
  b. defining a graph $G=(V, E_1, E_2)$, where V is a set of vertices, $E_1$ is a set of directed edges, and $E_2$ is a set of undirected edges, and wherein both a directed edge and an undirected edge can exist between a pair of vertices in the graph, the graph being constructed in accordance with the following rules:
    (i) for each node in the circuit, including input, output and inout nodes in the circuit, creating a vertex in the graph, ignoring power supply nodes and ground nodes;
    (ii) for every transistor in the circuit, adding a directed edge from the vertex representing the gate node of said transistor to the vertex representing the source node of said transistor if the source node is not a power supply node or a ground node, adding a directed edge from the vertex representing the gate node of said transistor to the vertex representing the drain node of said transistor if the drain node is not a power supply node or a ground node node, and adding an undirected edge between the vertices representing the source node and the drain node of said transistor if neither said source node nor said drain node is a power supply node or a ground node;
  c. in the defined graph, identifying loops of vertices having the following properties:
    (i) the loops consists of at least two directed edges;
    (ii) vertices representing input nodes can not be part of the loop;
    (iii) there must exist at least one input such that all pass from the input to any node in the loop consists of at least one undirected edge; and
    (iv) nodes that are part of the loop but do not have any out going directed edge can not be a state node; and
    (v) there exist at least one node in the loop from which all other nodes in the loop are reachable by a directed edges only.

* * * * *